United States Patent [19]

Staudinger et al.

[11] Patent Number: 5,045,821
[45] Date of Patent: Sep. 3, 1991

[54] BROADBAND MULTI-PHASE HYBRID

[75] Inventors: Joseph Staudinger; Warren L. Seely, both of Chandler, Ariz.

[73] Assignee: Motorola, Inc., Schaumburg, Ill.

[21] Appl. No.: 610,732

[22] Filed: Nov. 9, 1990

Related U.S. Application Data

[63] Continuation of Ser. No. 431,404, Nov. 3, 1989, abandoned.

[51] Int. Cl.⁵ .................... H03H 7/01; H03H 7/21; H03H 7/46
[52] U.S. Cl. .................... 333/118; 333/132; 333/138
[58] Field of Search ............... 333/100, 117, 118, 126, 333/129, 132-135, 119-125, 127, 128, 130, 131, 138

[56] References Cited

U.S. PATENT DOCUMENTS

| | | | |
|---|---|---|---|
| 2,771,518 | 11/1956 | Sziklai | 333/132 X |
| 3,058,071 | 10/1962 | Walsh et al. | 333/122 X |
| 3,146,409 | 8/1964 | Lalmond | 333/119 X |
| 3,192,490 | 6/1965 | Petts, III et al. | 333/119 |
| 3,691,485 | 9/1972 | Beck | 333/123 |
| 3,944,755 | 3/1976 | Takahashi et al. | 333/132 X |
| 4,841,262 | 6/1989 | Lomangino | 333/117 X |
| 4,893,098 | 1/1990 | Seely et al. | 333/118 X |

Primary Examiner—Paul Gensler
Attorney, Agent, or Firm—Eugene A. Parsons; Jordan C. Powell

[57] ABSTRACT

High and low pass filters are coupled to a power divider to create a multi-phase hybrid. The high and low pass filters, and the power divider, are all lumped element for compatibility with MMIC circuitry. The power divider may output, to the high and low pass filters, signals having equal or unequal amplitudes. Similarly, the high and low pass filters may output signals having equal or unequal phases.

4 Claims, 1 Drawing Sheet

BROADBAND MULTI-PHASE HYBRID

This application is a continuation of prior application Ser. No. 431,404, filed Nov. 3, 1989, now abandoned.

BACKGROUND OF THE INVENTION

This invention relates, in general, to hybrids, and more specifically, to multi-phase broadband MMIC hybrids.

Broadband hybrids are basic building blocks for many analog microwave circuits. Until recently, most hybrids have been constructed for use at low frequencies. For low frequencies, hybrids have been constructed with ferrite materials which resulted in adequate power performances. However, advances in technology opened the way for greater use of circuits operating in the high frequency ranges. At microwave frequencies, hybrids have generally been constructed in distributed fashion, such as coupling two transmission lines together, or using multiple methods of construction such as are used in Large couplers. Unfortunately, such hybrids are not suitable for monolithic microwave integrated circuits (MMIC).

MMIC circuits are best suited to lumped element components due to the small available circuit area. Some MMIC hybrids have implemented lumped elements, but these MMIC hybrids have very narrow bandwidths. For instance, U.S. Pat. No. 4,893,098 issued Jan. 9, 1990 to the same inventors, and having the same assignee, as the present invention, incorporates lumped elements, but is limited to a bandwidth of less than an octave.

SUMMARY OF THE INVENTION

Accordingly, it is an object of the present invention to provide a wide-band lumped element multi-phase hybrid which is compatible with MMIC circuitry.

High and low pass filters are coupled to a power divider to create a multi-phase hybrid. The high and low pass filters and the power divider all use lumped elements for compatibility with MMIC circuitry. The power divider may output, to the high and low pass filters, signals having equal or unequal amplitudes. Similarly, the high and low pass filters may output signals having equal or unequal phases.

The above an other objects, features and advantages of the present invention will be better understood from the following detailed description taken in conjuction with the accompanying drawings.

DETAILED DESCRIPTION OF THE INVENTION

Figure 1:
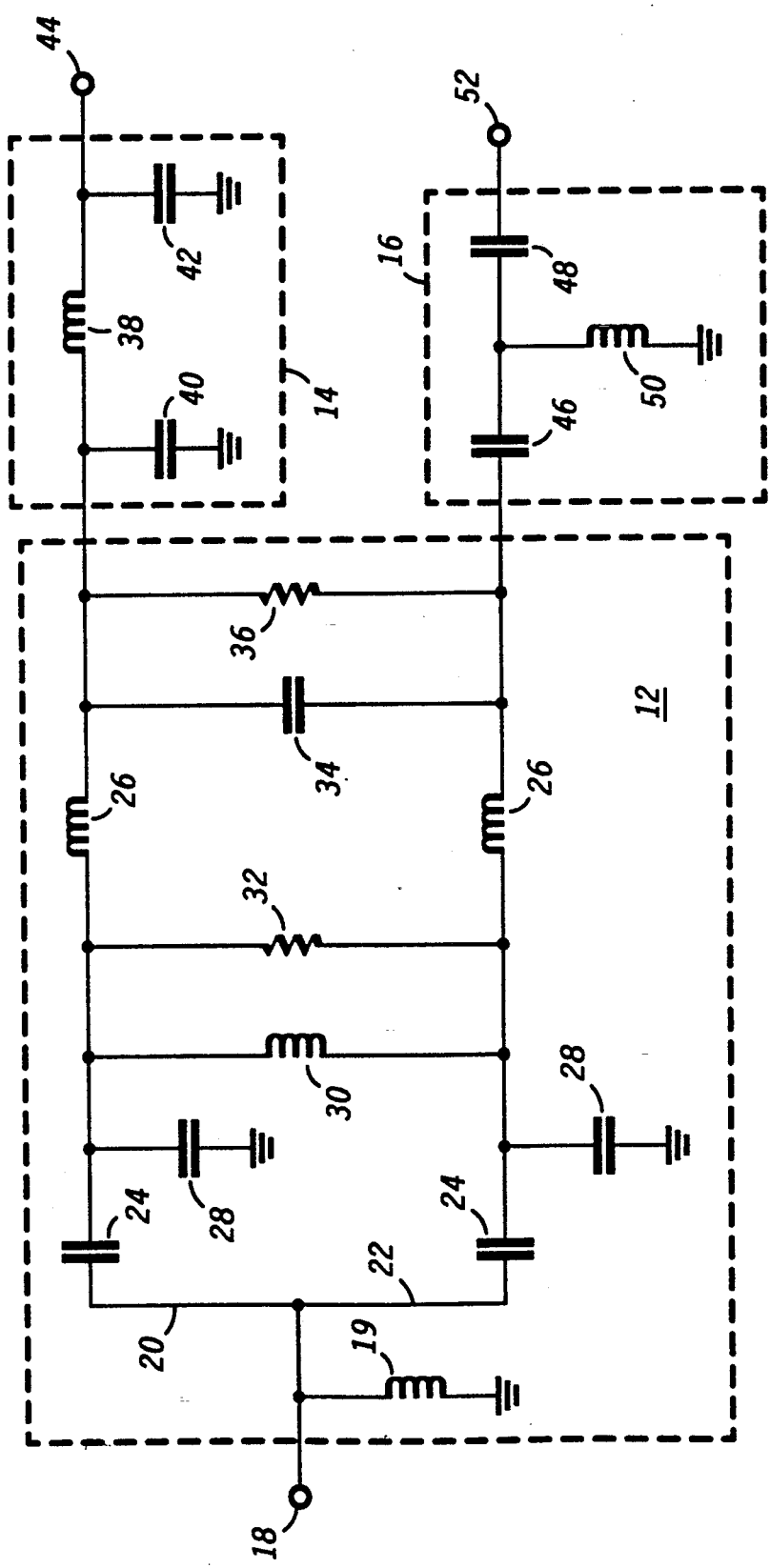
FIG. 1 is a diagram of a wide-band MMIC lumped element multi-phase hybrid according to the present invention.

FIG. 1 shows a broad band MMIC multi-phase hybrid which generally comprises a power divider 12 and phase shifters 14 and 16. Power divider 12 is a passive power divider which receives an input signal from terminal 18 and divides the signal between phase shifters 14 and 16. The split in amplitude of the input signal may be equal or unequal, and is determined by the values of the lumped elements of power divider 12.

An input signal from terminal 18 is inductively coupled to ground by inductor 19. The signal is then split between two signal paths 20 and 22. Both paths 20 and 22 comprise capacitors 24 coupled to inductors 26. Paths 20 and 22 are capacitively coupled, through capacitors 28, to an electric ground between capacitors 24 and inductors 26. Isolation inductor 30 and first isolation resistor 32 are coupled in parallel between paths 20 and 22 and are coupled to inductors 26.

Power divider 12 further comprises isolation capacitors 34 and second isolation resistor 36 which are coupled in parallel between paths 20 and 22. Isolation resistor 36 and isolation capacitor 34 are both coupled to inductors 26 as shown in FIG. 1. Those skilled in the art will recognize from the FIGURE and from the elements described above that power divider 12 is an in-phase divider having high isolation between output ports.

Power divider 12 is a low loss power divider as shown in FIG. 1 in its preferred embodiment. Other low loss power dividers compatible with MMIC circuitry may be substituted for the circuit lay-out of FIG. 1. For instance, the power divider described in U.S. Pat. No. 4,851,795, issued Jul. 25, 1989 to William B Beckwith and assigned to the same assignee as the present invention, may be used as power divider 12.

Path 20 outputs to phase shifter 14. Phase shifter 14, a low pass filter (LPF), comprises inductor 38 coupled between capacitors 40 and 42. A LPF terminal 44 is coupled capacitor 42 for outputting the signal from phase shifter 14.

Path 22 outputs to phase shifter 16. Phase shifter 16, a high pass filter (HPF), comprises capacitors 46 and 48, and inductor 50 coupled between capacitors 46 and 48. An output terminal 52 is coupled to capacitor 48.

Phase shifters 14 and 16 may be designed to output signals having equal and opposite phase or having unequal phase. The optimum performances of phase shifters 14 and 16 results when the outputs of each have equal and opposite phase. For instance, outputs of +45 degrees and −45 degrees would be an optimum setting for phase shifters 14 and 16. Similarity, outputs of +90° and −90° would yield optimum performances. In circuits where right angle phase shifts are needed, the outputs could be 30° and 60°, but the circuit would suffer somewhat in bandwidth. The values of the various elements of phase shifters 14 and 16 will vary the phase of the outputs.

Although phase shifters 14 and 16 have been specifically described, other low loss high and low pass filters compatible with MMIC circuitry may be used.

Test results show that the combination of a low loss power divider, such as power divider 12, with low loss high and low pass filters, such as phase shifters 14 and 16, result in broad band-widths of above an octave.

Thus there has been provided, in accordance with the present invention, a broad-band multi-phase hybrid that fully satisfies the objects; aims, and advantages set forth above. while the invention has been described in conjuction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A multi-phase hybrid coupler comprising:
    a passive in-phase power divider with lumped elements having first and second output terminals and an input terminal, said passive in-phase power divider having additional lumped elements providing high isolation between said first and second output terminals;

a passive high pass filter with lumped elements having an input terminal coupled to the first output terminal of said in-phase power divider and an output terminal for supplying a first output signal with a first phase;

a passive low pass filter with lumped elements having an input terminal coupled to the second output terminal of said in-phase power divider and an output terminal for supplying a second output signal with a second phase approximately ninety degrees from the phase of said first output signal.

2. A multi-phase hybrid coupler as claimed in claim 1 wherein the passive in-phase power divider, the passive high pass filter and the passive low pass filter are composed of lumped resistive, capacitive and inductive elements.

3. A multi-phase hybrid coupler as claimed in claim 2 wherein the lumped resistive, capacitive and inductive elements of the passive in-phase power divider, the passive high pass filter and the passive low pass filter cooperates to provide a broad band-width frequency response.

4. A multi-phase hybrid coupler as claimed in claim 1 wherein the passive high pass filter and the passive low pass filter each are three pole filters.

* * * * *